United States Patent [19]
McLaury

[11] Patent Number: 5,323,350
[45] Date of Patent: Jun. 21, 1994

[54] INTEGRATED CIRCUIT MEMORY WITH DUAL P-SENSE AMPLIFIERS ASSOCIATED WITH EACH COLUMN LINE

[75] Inventor: Loren L. McLaury, Boise, Id.
[73] Assignee: Micron Technologies, Inc., Boise, Id.
[21] Appl. No.: 931,720
[22] Filed: Aug. 18, 1992
[51] Int. Cl.$^5$ .............................................. G11C 11/40
[52] U.S. Cl. .................................. 365/208; 365/206; 365/207; 365/189.01
[58] Field of Search ............ 365/208, 206, 207, 189.01

[56] References Cited
U.S. PATENT DOCUMENTS

| | | | |
|---|---|---|---|
| 4,636,987 | 1/1987 | Norwood et al. | 365/208 |
| 4,748,349 | 5/1988 | McAlexander, III et al. | 307/530 |
| 5,053,997 | 10/1991 | Miyamoto et al. | 365/206 |

Primary Examiner—Eugene R. LaRoche
Assistant Examiner—Huan Hoang
Attorney, Agent, or Firm—Dorr, Carson, Sloan & Peterson

[57] ABSTRACT

A DRAM or VRAM integrated circuit memory of the divided bit line design includes a bit line pair extending from a column decoder to a SAM. An N-sense amplifier divides the bit line pair into two pairs of bit halves. The N-sense amplifier is connected to each of the bit line halves through an isolation transistor. A P-sense amplifier is connected across each pair of the bit line halves. Since a P-sense amplifier is associated with each pair of bit line halves, the P-sense amplifier never has to pull through isolation transistors, and thus the isolation transistors can be high threshold transistors, eliminating the natural threshold mask step in fabrication. The two P-sense amplifiers separate the bit line voltages faster, thereby decreasing crossing current and saving power, and pull the bit lines to full high voltage levels.

9 Claims, 6 Drawing Sheets

DRAM ACCESS CYCLE

INTEGRATED CIRCUIT MEMORY WITH DUAL P-SENSE AMPLIFIERS ASSOCIATED WITH EACH COLUMN LINE

BACKGROUND OF THE INVENTION

1. Field of the Invention

The invention in general relates to integrated circuit memories and more particularly with the architecture of the sensing and write back circuits connected to the memory cells.

2. Statement of the Problem

Integrated circuit memories generally contain a two dimensional array of storage cells arranged in rows and columns. A common architecture is to connect all cells in a row to a common row line, often referred to as the "word line" and all cells in a column to a common column line often called the "bit line" or "digit line". In this architecture, the row line provides a signal which enables cells to receive or output a data signal and the column line provides the input or output line on which the signal is transferred. An individual cell is addressed via a row decoder that selects a row to be addressed and a column decoder which selects a column to be addressed, thereby selecting one particular cell at the corresponding row and column location. The cell is accessed by placing an enable signal on the row line in the row associated with the cell and reading or writing a signal on the column line associated with the cell.

Integrated circuit memories are also generally binary logic circuits in which information is stored and transferred as voltages representing complementary logic values that are alternately referred to as "true and false", "logic 1 and logic 0", or "logic high and logic low". Typically a voltage of 5 volts may represent the logic 1 state while a voltage of zero volts represents the logic 0 state. Because of the constraints of resistance, capacitance etc. the individual voltages input to or output on the column. lines by individual cells are usually at some intermediate voltage. Thus subcircuits are associated with the column lines of integrated circuit memories to pull the high voltage values up to, or as close as possible to, the full logic 1 voltage, for example 5 volts, and to pull the low voltages down to as close to the logic 0 voltage, for example 0 volts, as possible. These subcircuits are commonly referred to as sense amplifiers. A common architecture utilizes a separate pull down subcircuit, referred to as an N-sense amplifier, to pull the low signals down to the logic 0 voltage, and a separate pull up subcircuit, referred to as a P-sense amplifier, to pull the high voltages up to the logic 1 voltage.

The invention to be disclosed herein is particularly applicable to an architecture used in dynamic random access memories (DRAM) and video random access memories (VRAM). In this architecture the individual memory cell comprises a transistor and a capacitor connected in series. One side of the capacitor is connected to a reference voltage, and the other side is connected to the column line through the transistor. The gate of the transistor is connected to the row line. Information is stored in the form of charge on the capacitor, which charge is input and output via the column line and gated by the row line acting on the transistor gate. There are tens or even hundreds of such cells connected to each column line. The column lines are organized into pairs with one N-sense amplifier and one P-sense amplifier associated with each pair. The N-sense amplifiers and P-sense amplifiers are connected across the pairs, with one column line going low and the other going high when one of the pairs of lines is addressed. The attachment of the transistor gates to row lines is staggered with the cells associated with adjacent pairs of column lines belonging to different rows so that the transistor which gates one of each associated pair will be off when a cell On the other of the pair is being addressed. That is, when a particular cell is addressed, the column line it is attached to will go high or low, depending on the cells content; the other column line of the pair will go to the opposite logic value. When the read or write cycle is over, the pairs are shorted together, which quickly brings them to a mid-voltage level, resetting them for the next cycle. In this way the pairing of the lines results in faster cycling of the circuit as a whole. Since the connection of the cells to the row lines are staggered, the transistor gates associated with the one of the line pair that is not being addressed are always off and the information in the cells is not affected by the column line of the non-addressed cells going high or low. This architecture is referred to as "divided bit line sensing". A common arrangement of the various parts of the circuit in the divided bit line sensing approach is to locate the column decoder and DRAM input and output terminals at one end of the column lines, the P-sense amplifiers at the other end of the column lines, and the N-sense amplifiers at the center of the column lines thereby dividing each the column lines into two halves, one half of the line extending between the N-sense amplifier and the column decoder and the other half extending between the N-sense amplifier and the P-sense amplifier. In VRAM a sequential-access memory (SAM) port is connected to the column lines on the side of the P-sense amplifier away from the column decoder.

As is well-known, integrated circuit memories are generally mass produced by fabricating hundreds of identical circuit patterns on a single semiconducting wafer, which wafer is subsequently sawed into hundreds of identical dies or chips. The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. However, the smaller the size of the individual cell, the smaller the size of the individual electrical components in the cell, and the smaller the electrical signals associated with them. As more and more individual storage cells are placed onto a single chip, the length of the column lines connecting the individual cells to the amplifiers becomes longer and longer as compared to the individual cell size, and the capacitance associated with the lines becomes larger. This means that the signal transferred to the column line from an individual cell will become even smaller as the capacitance of the line absorbs the charge, and further that the time for developing a useful signal level on the line will increase. As is well known, speed is an important factor in such memories, since the faster the cells can be read, the faster is the computer of which the memory is a part, and the more operations the computer can do. Thus a number of enhancements have been made to DRAM and VRAM architecture to increase the signal level and amplifier response time. Several such enhancements are described in U.S. Pat. Nos. 4,748,349 and 4,636,987. The former patent describes a circuit which boosts the voltage on the row line and thus the gate of the gating transistors to a value above the high logic voltage of the circuit. This permits the full high logic voltage to be placed on the cell capacitor, since the threshold voltage drop across the gating transistor is eliminated. The latter patent describes an architecture in which each N-Sense amplifier is connected to each of the four column line pair halves associated with it through an isolation transistor. The gates of the isolation transistors are connected to a timing signal which isolates the N-sense amplifier from the column line pair halves on the opposite side of the N-sense amplifier from the row that is being addressed. That is, when the row being addressed is on, say, the left side of the N-sense amplifier, the isolating transistors connecting the N-sense amplifier to the left halves of the column line pair are on while the isolating transistors on connecting the N-sense amplifier to the halves on the right side of the N-sense amplifier are off. Thus the N-sense amplifier is connected to only half of the full column line during the time the N-sense amplifier signal is developing, which doubles the signal that the addressed cell develops at the N-sense amplifier. However, this architecture creates several disadvantages. First, for the cells on the opposite side of the N-sense amplifier from the P-sense amplifier, i.e., the cells between the N-sense amplifier and the column decoder, the voltage developed at the P-sense amplifier must pull through the two isolation transistors, thus the voltage for these accesses can never be pulled to the full logic 1 voltage, but is down $V_T$, the threshold voltage of the isolation transistors. Further, in order to prevent the voltage drop $V_T$ from being too large, the isolation transistors have to be natural threshold N-channel transistors. Since all the transistors in the DRAM or VRAM integrated circuit except these are high impedance transistors, this architecture requires an additional mask step in fabrication process, i.e. a natural threshold transistor mask step. Thus there is a need for a DRAM and VRAM architecture that allows the voltage doubling at the N-sense amplifiers but does not decrease the voltage that can be developed on the opposite side of the N-sense amplifier near the column decoder, and can tolerate high impedance N-sense amplifier isolation transistors.

For many applications of integrated circuit memories, such as for portable computers and other battery powered intelligent devices, the amount of power available is limited. Thus it is important that sense amplifiers not only are fast and small, but also consume a minimum of power. During the period when the N-sense and P-sense amplifiers are separating the voltages on the column line pairs, the sense amplifiers pass through an intermediate state in which current flows through them from Vcc to ground. This current is called crossing current. The faster the column line pairs separate, the less crossing current. In sum, it would be highly desirable to have an integrated circuit memory architecture that not only increases the voltage developed at the P-sense. amplifiers and permits high impedance N-sense amplifier isolation transistors, but also pulls the column line pairs apart faster, resulting in less crossing current and more efficient use of power.

3. Solution to the problem

The present invention solves the above problems by employing dual P-sense amplifiers in the memory architecture. One P-sense amplifier is located on either side of each N-sense amplifier.

Two P-sense amplifiers are associated with each column line pair, one P-sense amplifier being associated with each pair of column line halves. Preferably, one P-sense amplifier is located at the SAM end of the column line pair and another P-sense amplifier is located at the column decoder end of the column line pair.

With the above arrangement of P-sense amplifiers, the P-sense amplifiers never have to pull through the isolation transistors. Therefore these transistors can be high impedance transistors just as the other transistors in the integrated circuit, and a fabrication step can be eliminated.

Moreover, since the invention provides independent control of the high voltage on both sides of the N-sense amplifier, both halves of the column lines can be charged all the way to the full logic 1 voltage. This full voltage can then be written to all the storage cells, on both sides of the sense amplifier, providing substantially improved performance over the previous art.

With the additional P-sense amplifier the separation of the voltages on the column lines is faster resulting in a higher speed of operation, and therefore a faster memory.

The faster separation of the column lines means that the sense amplifiers spend less time in the intermediate states in which crossing current flows, and thus there is less crossing current and more efficient use of power.

SUMMARY OF THE INVENTION

The invention provides an integrated circuit memory comprising: an array of memory cells arranged in a plurality of rows and at least one column; a plurality of row lines, each row line connecting cells in a row; a first column line connecting cells in a column, the first column line divided into a first column line portion and a second column line portion; a first N-sense amplifier connected to the first column line; first isolating means for isolating the first N-sense amplifier from the first column line portion and second isolating means for isolating the first N-sense amplifier from the second column line portion, the first N-sense amplifier connected to the first column line portion through the first isolating means and to the second column line portion through the second isolating means; a first P-sense amplifier connected to the first column line portion; and a second P-sense amplifier connected to the second column line portion. Preferably, each of the memory cells comprises a transistor and a capacitor, and wherein the first isolating means and second isolating means comprise transistors having the same impedance as the transistors in the memory array. Preferably, there are a plurality of the first column lines, each first column line is divided into a first column line portion and a second column line portion, and each first column line has associated with it one of the first N-sense amplifiers, one of the first isolating means, one of the second isolating means, one of the first P-sense amplifiers, and one of the second P-sense amplifiers. Preferably, the integrated circuit memory further comprises: input/output means for connecting the second column line portion to a circuit external of the memory array; row decoder means for addressing one of the rows in response to a row address signal; timing signal generator means for providing an N-sense timing signal defining an N-sense period, a P-sense timing signal defining a P-sense period, and an isolation timing signal related to whether the row being addressed by the row decoder means is connected to a cell connected to the first column line portion or a cell connected to the second column line portion; and the first P-sense amplifier comprises means responsive to the P-sense timing signal for amplifying the signal on the first column line portion during the P-sense period; the second P-sense amplifier comprises means responsive to the P-sense timing signal for amplifying the signal on the second column line portion during the P-sense period; and the first isolating means comprises means responsive to the isolation timing signal for isolating the first column line portion from the second column line portion, the first N-sense amplifier, and the second P-sense amplifier during an initial portion of the N-sense period while a row line associated with the second column line portion is being addressed. Preferably, the first isolating means and second isolating means comprise natural threshold transistors. Preferably, the integrated circuit memory further comprises: a second column line divided into a third column line portion and a fourth column line portion; a second N-sense amplifier connected to the second column line; third isolating means for isolating the second N-sense amplifier from the third column line portion and fourth isolating means for isolating the second N-sense amplifier from the fourth column line portion, the second N-sense amplifier connected to the third column line portion through the third isolating means and to the fourth column line portion through the fourth isolating means; a third P-sense amplifier connected to the third column line portion; and a fourth P-sense amplifier connected to the fourth column line portion. Preferably, there are a plurality of the first column lines and the second column lines, each first column line is divided into a first portion and a second portion, each second column line is divided into a third column line portion and a fourth column line portion, each first column line has associated with it one of the first N-sense amplifiers, one of the first isolating means, one of the second isolating means, one of the first P-sense amplifiers, and one of the second P-sense amplifiers, and each second column line has associated with it one of the second N-sense amplifiers, one of the third isolating means, one of the fourth isolating means, one of the third P-sense amplifiers, and one of the fourth P-sense amplifiers.

In another aspect, the invention provides an integrated circuit memory comprising: an array of memory cells arranged in a plurality of rows and columns; a plurality of row lines, each row line connecting cells in a row; a first column line pair comprising a first column line connecting cells in one column and a second column line connecting cells in an adjacent column; a first N-sense amplifier connected between the first column line pair and dividing the first column line pair into a first pair of column line halves and a second pair of column line halves; a first isolating transistor connecting the first N-sense amplifier to one of the first pair of column line halves, a second isolating transistor connecting the first N-sense amplifier to the other of the first pair of column line halves, a third isolating transistor connecting the first N-sense amplifier to one of the second pair of column line halves, and a fourth isolating transistor connecting the first N-sense amplifier to the other of the second pair of column line halves; a first P-sense amplifier connected across the first pair of column line halves; and a second P-sense amplifier connected across the second pair of column line halves. Preferably, each of the memory cells comprises a transistor and a capacitor, and wherein the first, second, third, and fourth isolating transistors have the same impedance as the transistors in the memory array. Preferably, the first, second, third, and fourth isolating transistors are natural threshold transistors.

In a further aspect the invention provides an integrated circuit memory comprising: an array of memory cells arranged in a plurality of rows and columns; a plurality of row lines, each row line connecting cells in a row; a first column line pair comprising a first column line connecting cells in one column and a second column line connecting cells in an adjacent column; an N-sense amplifier connected between the first column line pair and dividing the first column line pair into a first pair of column line halves and a second pair of column line halves; a first isolating transistor connecting the first N-sense amplifier to one of the first pair of column line halves, a second isolating transistor connecting the first N-sense amplifier to the other of the first pair of column line halves, a third isolating transistor connecting the first N-sense amplifier to one of the second pair of column line halves, and a fourth isolating transistor connecting the first N-sense amplifier to the other of the second pair of column line halves; a first P-sense amplifier connected across the first pair of column line halves, the first P-sense amplifier capable of pulling one of the first pair of column line halves up to a full circuit voltage; and power saving means connected across the second pair of column line halves for pulling one of the second pair of column line halves up to the full circuit voltage while saving power in the overall operation of the integrated circuit memory. Preferably, the power saving means comprises means for separating the voltages on the second pair of column line halves faster than is possible with just the first P-sense amplifier thereby providing a faster integrated circuit memory. Preferably, the power saving means further comprises means for decreasing the crossing current used by the integrated circuit memory. Preferably, the power saving means comprises a second P-sense amplifier.

The invention not only provides a memory architecture that simplifies the fabrication process, allows the full logic 1 voltage to be applied to all cells, and saves power, but it also provides a faster memory. Numerous other features, objects and advantages of the invention will become apparent from the following description when read in conjunction with the accompanying drawings.

DESCRIPTION OF THE PREFERRED EMBODIMENT

1. Overview

Figure 1:
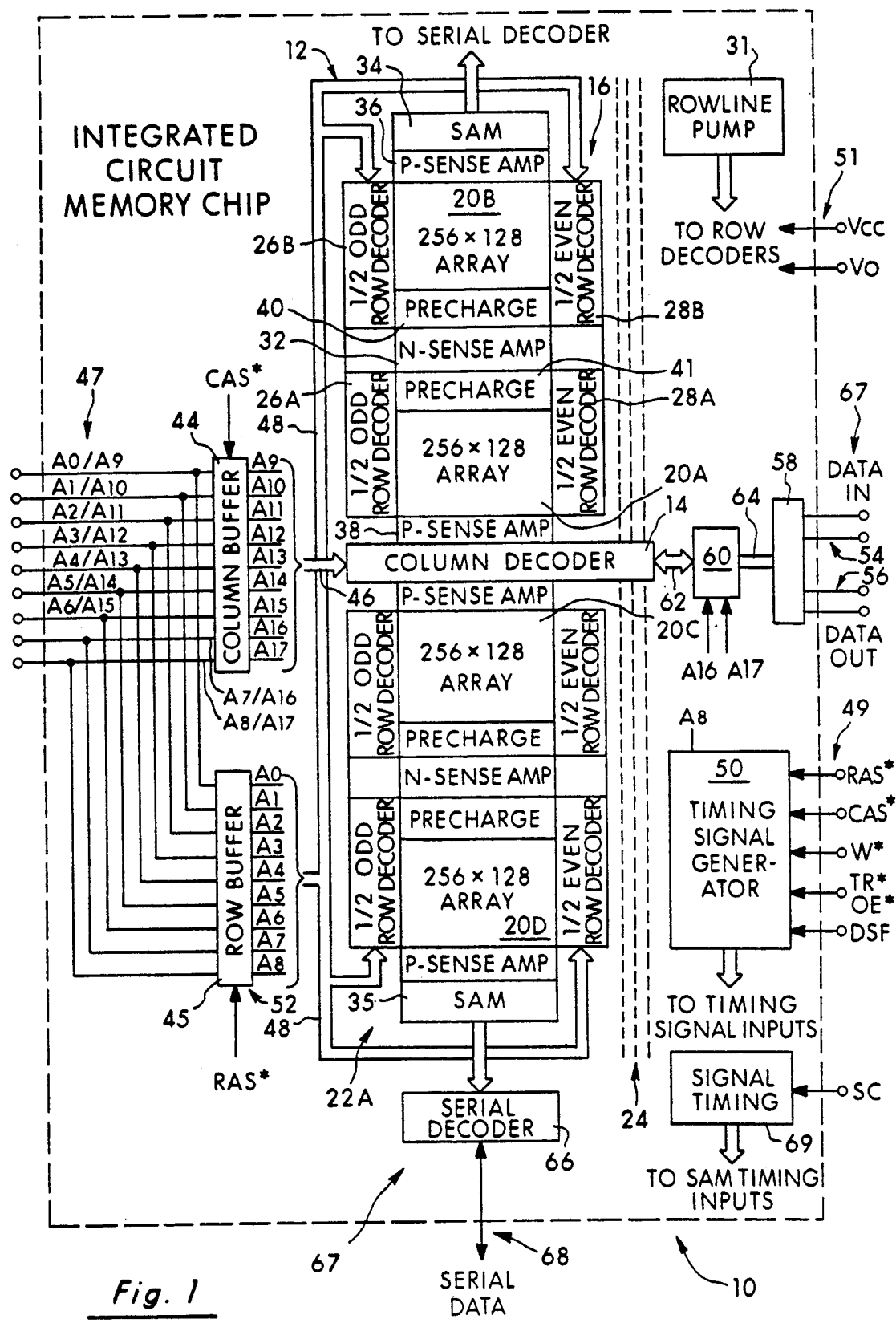
FIG. 1 is a block circuit schematic of an 512K integrated circuit memory according to a preferred embodiment of the invention.
Figure 2:
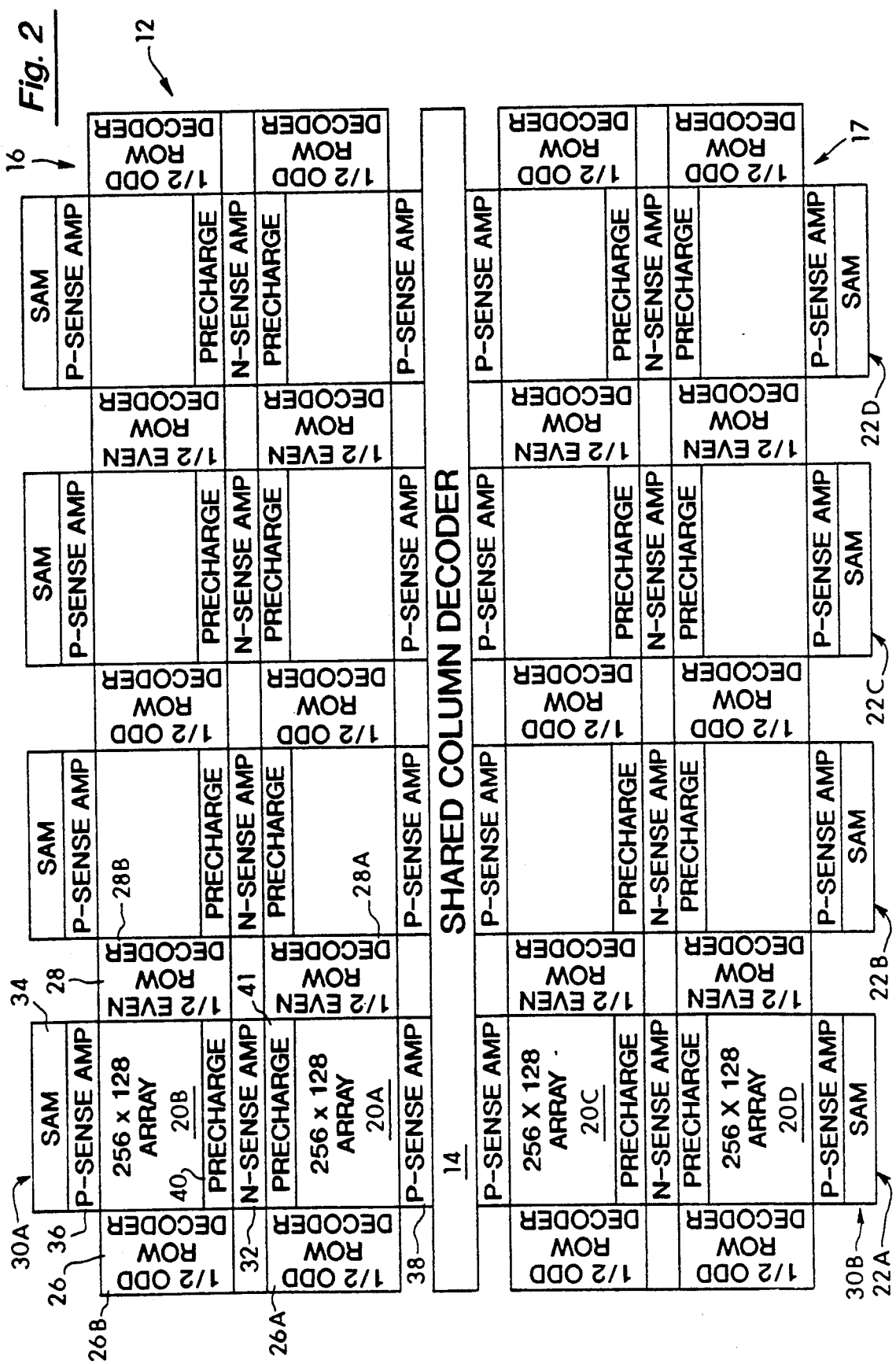
FIG. 2 is a block diagram illustrating the full array of the embodiment of FIG. 1.

Turning now to FIG. 1, there is shown an integrated circuit memory chip 10 according to the preferred embodiment of the invention. It should be understood that the particular embodiments described herein are exemplary, and are described in detail to more clearly and fully depict the invention than would otherwise be possible; they are not meant to limit the invention to these particular embodiments. The integrated circuit 10 comprises a memory circuit 12 which includes a column decoder 14, a row decoder 16, and a 1024×512 array 17 (FIG. 2) of memory cells 18 (FIG. 3), which array 17 is broken down into sixteen 256×128 smaller arrays 20. Because of space limitations, only one quadrant 22A including four arrays 20A, 20B, 20C, and 20D are shown in FIG. 1; three other quadrants 22B, 22C, and 22D (FIG. 2) are indicated by the three dotted lines 24 in FIG. 1. The full memory circuit 12 including sixteen arrays 20A, 20B, etc. is shown in FIG. 2. The full circuit 12 can be understood most easily if thought of as eight 512×128 arrays 30A, 30B, etc. each of which includes two 256×128 arrays, such as 20A and 20B, an odd row decoder 26 which is separated into two halves 26A and 26B, an even row decoder 28 which is separated into two halves 28A and 28B, an N-sense amplifier region 32, a column decoder 14 at one end, a SAM (sequential-access memory) region 34 at the other end, two P-sense amplifier regions 36 and 38, and two precharge circuit regions 40 and 41. Each of these 512×128 arrays 30A, 30B, etc. may also include other subcircuits, but these shall not be described as they are not directly related to the invention to be described. This particular embodiment selected to describe the invention is what is commonly known as a 512Kbit memory circuit in a 256K×2 architecture. As is well known in the art, a 512Kbit circuit actually has capacity for 524,288 bits which is equal to the 512×1024 cells.

The integrated circuit 10 is an 22 pin chip. Nine of the pins, indicated at 47, connect to the address buffers 44 and 45 which in a known manner use the CAS* and RAS* timing signals respectively to multiplex the incoming signals to output the row address signals A0 to A8 on lines 48 which connect to the row decoder 16, to output the column address signals A9 through 15 on lines 46 which connect to column decoder 14, and to output the column address signals A16 and A17 to a two-of-eight decoder 60. Row access means 52, comprises the inputs 47 and row buffer 45, and provides a signal, A8, which is directed to both the row decoder 16 and the timing signal generator 50. The address signals A0 through A15 are used to access one cell in each of the eight 512×128 arrays 30A, 30B, etc. on each access cycle. The RAS*, CAS*, W*, TR*, OE*, and DSF signals are input on five of the pins, indicated at 49, to a timing signal generator means 50, while the serial clock signal, SC, is input to a serial timing signal generator 69. Note that TR* and OE* are input to the same pin, as is common practice. The timing signal generators 50 and 69 use these signals, a conventional internal clock, and conventional logic circuitry to generate the required timing signals required by chip 10. It is noted that it is possible that in some chips some signals input to the chip, such as the RAS* or CAS* signals, may pass directly to the circuitry that uses them, such as the row buffer 45 and the column buffer 44, respectively. In this case, the input pins on which these signals are input would be considered to be part of the timing signal generator means 50, 69. In other words, the term "timing signal generator means" is intended to be as broad as possible, and includes the sources of all the timing signals used on the chip. The timing signals are used by the chip circuitry, in a manner to be described in detail below. Another two of the pins, indicated by 51, are used to input the logic 1 voltage, $V_{CC}$, and the logic zero voltage, $V_0$. Another two pins 54 provide two lines of data input while two pins 56 provide two lines of data output. The final pin 68 provides the serial data connection. Parallel input 54 and output 56 are connected to input/output buffer and control circuit 58. A two-of-eight decoder 60 utilizes the A16 and A17 signals from column buffer 44 to connect two of the eight pairs of input/output lines 62 coming from column decoder 14 to the dual line 64 which connects to the input/output buffer and control circuit 58. SAM regions 34 and 35 connect to serial decoder 66 which multiplexes the SAMs to the serial input and output lines 68 and 69 respectively. The integrated circuit chip 10 also includes a row line pump circuit 31 which is essentially a large capacitor which connects to the row decoders 16. The structure of such row line pump circuits is well-known and will not be discussed in detail herein.

The particular embodiment is what is generally known as a VRAM (Video Random Access Memory). A DRAM (Dynamic Random Access Memory) would be exactly the same except it would not include the SAM regions 34 and 35, the serial decoder 66, the serial input 68, and serial timing generator 69. In the discussion below, in order to avoid the redundancy of separate drawings for DRAM circuits, we shall sometimes refer to a DRAM cycle in reference to FIGS. 1, 2, or another figure showing one or more SAMs. In such discussions of DRAM functions, it is intended that the SAMs would not function or otherwise be ignored, and all inputs and outputs would be via column decoder 14. As will be seen below, the input/output means 67 of the invention can be considered to be either the column decoder 14 together with the lines 62, decoder 60, control circuit 58, inputs 54 and outputs 56, or the SAMs together with serial decoder 66, serial input and output 68, or any other input/output circuits used with integrated circuit memories.

An important aspect of the invention is that each of the eight 512×128 arrays 30A, 30B, etc. include two P-sense amplifier regions 36 and 38, i.e. one P-sense amplifier region 30 at the distal end of the array from the column decoder 14 and another P-sense amplifier region 38 adjacent the column decoder 14. The prior art memory circuits 12 included only the P-sense amplifier region 36 in each array 30A, 30B, etc. As will be discussed below, this additional P-sense amplifier region directly results in numerous advantages, including faster separation of the logic 1 and logic 0 voltages, the ability to pull the high voltage lines to the full logic 1 voltage, and the elimination of a mask step in the fabrication process, and indirectly leads to many other advantages such as a faster memory.

2. The Memory Array Circuitry

Figure 3:
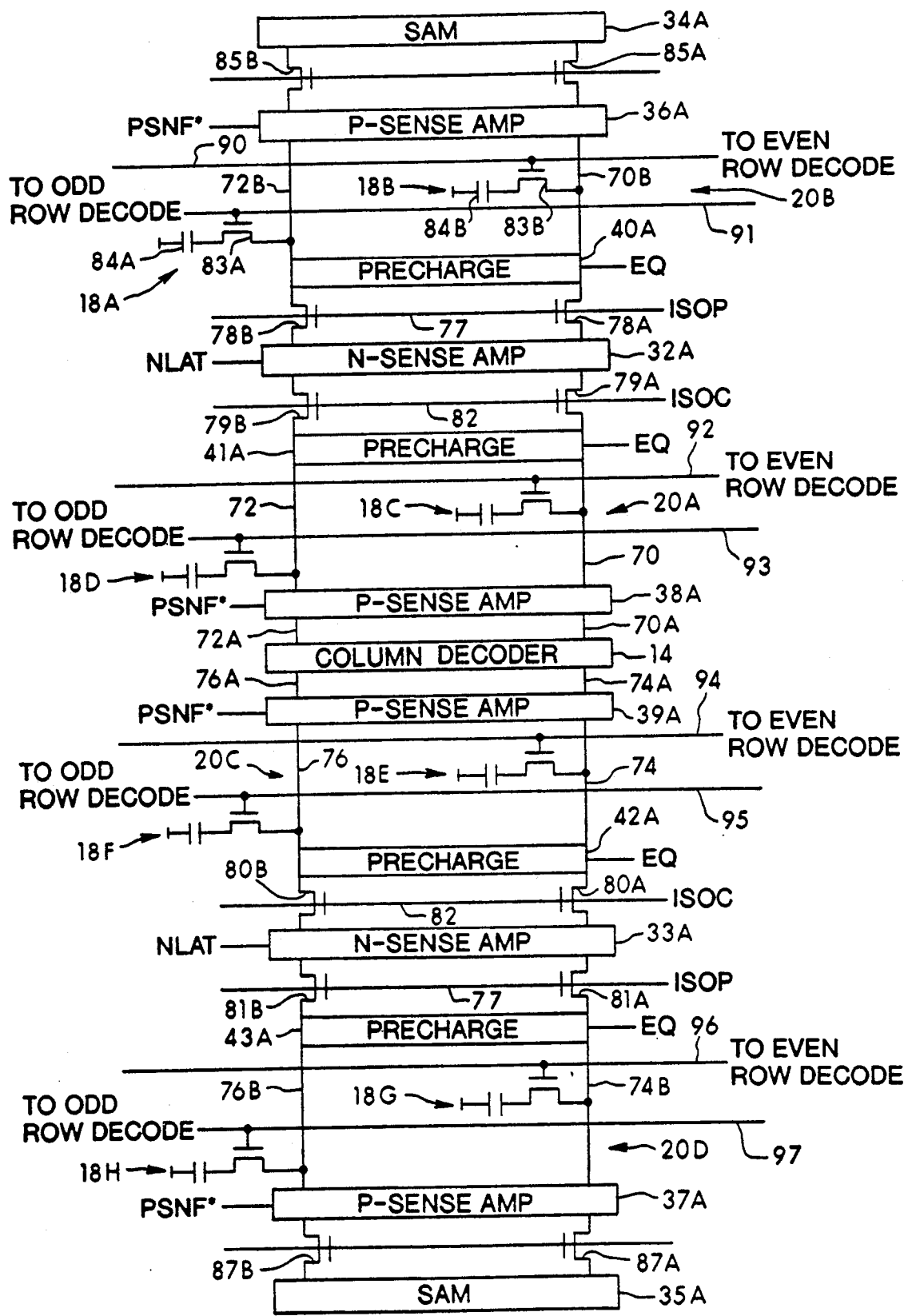
FIG. 3 is a circuit diagram illustrating the electronic architecture of one quadrant of an array according to a preferred embodiment of the invention.

FIG. 3 illustrates the circuitry in one memory quadrant, such as 22A. The circuit 71 includes column decoder 14, N-sense amplifiers 32A and 33A, P-sense amplifiers 36A, 38A, 37A, and 39A, precharge circuits 40A, 41A, 42A and 43A, SAMs 34A and 35A, a first column line pair 70 and 72 extending from column decoder 14 to SAM 34A and a second column line pair 74 and 76 extending column decoder 14 to SAM 35A. The circuit 71 also includes isolating means 78A, 78B, 79A, 79B, 80A, 80B, 81A, and 81B, and SAM signal pass gates 85A, 85B, 87A, and 87B, all of which are n-channel transistors in the preferred embodiment. Finally the circuit 71 includes row lines 90 through 97 and memory cells 18A through 18H, each of which includes a transistor, such as 83A, and a capacitor, such as 84A. Each memory cell 18A through 18H represents 128 such cells and each row line 90 through 97 represents 128 such lines. The invention can be used with or without row line pump circuitry.

The invention can be developed most generally by considering a single column line. From such a perspective, first N-sense amplifier 32A divides column line 70 into a first column line portion 70B and a second column line portion 70A, while second N-sense amplifier 33A divides second column line 74 into a third portion 74A and a fourth portion 74B. Further a first P-sense amplifier 36A is connected to the first column line portion 70B, a second P-sense amplifier 38A is connected to the second column line portion 70A, a third P-sense amplifier is connected to the third column line portion 74A, and a fourth P-sense amplifier is connected to the fourth column line portion 74B. And so on for first, second, third and fourth isolation means 78A, 79A, 80A, and 80B respectively. However, since the preferred embodiment is designed in the divided bit line pair architecture, it is clearer to discuss the invention in terms of bit line or column line halves. In these terms, N-sense amplifier 32A divides column line pairs 70 and 72 into two pairs of column line halves, 70A and 72A being a first pair of column line halves and 70B and 72B being a second pair of column line halves. Likewise N-sense amplifier 33A divides column line pair 74 and 76 into the pair of column line halves 74A and 76A and 74B and 76B.

The circuit 71 is connected as follows. Each of 128 capacitors 84A have one side connected to a reference voltage and the other side connected to column line half 72B through its corresponding transistor 83A. The gate of each of the 128 transistors 83A is connected to one of 128 odd row lines 91. Likewise, referring to cells 18B, each of 128 capacitors 84B has one side connected to the reference voltage and the other side connected to column line half 70B through a corresponding transistor 83B, with the gate of each of 128 such transistors connected to one of 128 even row lines 90. In a like manner, 128 cells 18C are connected to column line half 70A and 128 even row lines 92, 128 cells 18D are connected to column line half 72A and one of 128 odd row lines 93, 128 cells 84E are connected to column line half 74A and 128 even row lines 94, 128 cells 18F are connected to column line half 76A and 128 odd row lines 95, 128 cells 18G are connected to column line half 74B and 128 even row lines 96, and 128 cells 18H are connected to column line half 76B and 128 odd row lines 97. Column line half 72B is connected to SAM 34A through transistor 85B and column line half 70B is connected to SAM 34A through transistor 85A. P-sense amplifier 36A is connected across column line halves 70B and 72B, and precharge circuit 40A connects the same two column line halves. Column line half 70A is connected to N-sense amplifier 32A through isolation transistor 78A and column line half 72H is connected to N-sense amplifier 32A through isolation transistor 78B. Column line half 70A is connected to N-sense amplifier 32 through isolation transistor 79A and column line half 72A is connected to N-sense amplifier 32 through isolation transistor 79B. Precharge circuit 41 connects column line halves 70A and 72A, and P-sense amplifier 38 is connected across the same two column line halves. On the lower side of column decoder 14, P-sense amplifier 39A is connected across column line halves 74A and 76A, and precharge Circuit 42A connects the same two column line halves. N-sense amplifier 33A is connected to column line halves 74A, 76A, 74B, and 76B respectively through isolation transistors 80A, 80B, 81A, and 81B respectively. Precharge circuit 43A connects column line halves 74B and 76B, and P-sense amplifier 37A is connected across the same two column line halves. Column line half 74B is connected to SAM 35A through transistor 87A, while column line half 76B is connected to SAM 35A through transistor 87B. P-sense amplifiers 36A, 37A 38A, and 39A have inputs labeled PSNF*, which is the timing signal which enables and disables their operation. Likewise each of the precharge circuits 40A, 41A, 42A, and 43A and each of the N-sense amplifiers 32A and 33A have inputs labeled EQ and NLAT, respectively, the timing signals that enable and disable their operation. The gates of isolation transistors 78A, 78B, 81A, and 81B are connected to the line 77 which carries the timing signal ISOP. The gates of isolation transistors 79A, 79B, 80A, and 80B are connected to the line 82 which carries the timing signal ISOC. As shown in FIG. 1, the column decoder 14 has inputs from the column buffer 44 and outputs to the output decoder 60, and the SAM has outputs to the serial decoder 66. These inputs and outputs as well as other details of the column decoder 14 and SAMs 34A and 35A are known in the art and will not be discussed in detail. The design of N-sense amplifiers 32A, and 33A, P-sense amplifiers 36A, 37A, 38A, and 39A, and precharge circuits 40A, 41A, 42A, and 43A, are also known in the art and thus will not be discussed in detail herein. There are 128 circuits such as 71 in each quadrant, such as 22A. Each of the even row lines 90, 92, 94, and 96 (each representing 128 such row lines) connect to one of the 128 transistors in the cells that are connected to the right hand column line of the column line pair in each such circuit, and each of the odd row lines 91, 93, 95, and 97 (each representing 128 such row lines) connect to one of the 128 transistors in the cells that are connected to the left hand column line of the column line pair in each such circuit. With 128 such circuits 71, and with 128 cells connected to even row lines and each right hand column line half, plus 128 cells connected to odd row lines and each left hand column line half, we arrive at the 256×128 cells in each array such as 20B.

As indicated above, the circuit 71 differs from the prior art memory array circuits in that it has an additional P-sense amplifier 38A associated with the upper column line pair 70 and 72 and an additional P-sense amplifier 39A associated with the lower column line pair 74 and 76. From the description of the connection of the circuits above, several advantages of having an the additional P-sense amplifier associated with each column line pair is evident. First of all, each pair of column line halves has a P-sense amplifier acting directly on them. Thus the voltage on them will separate to logic 1 and logic 0 faster resulting in a higher speed memory and less crossing current, and thus lower power use. Secondly, when column line half 70A goes high, it no longer has to be pulled up to the high logic state through a pair of transistors 78A and 79A. Rather it is pulled up to the high logic state via P-sense amplifier 38A. Thus, with the use of a row line pump circuit 31 (FIG. 1), the memory cells, such as 18C, can be pulled up to the full logic 1 voltage. Likewise for column line halves 70A, 72A, 74A, and 76A located closest to the column decoder and their respective memory cells. Thirdly, since the circuit no longer has to pull the column line halves located closest the column decoder up through the isolating transistors 78A through 81B, these transistors no longer must be low or natural threshold transistors, but can be high threshold transistors like all the other transistors 83A, etc. in the memory circuit 12. Thus the fabrication mask step that was used to make the low threshold isolation transistors in the prior art can be eliminated.

3. The Circuit Timing and Function

Figure 4:
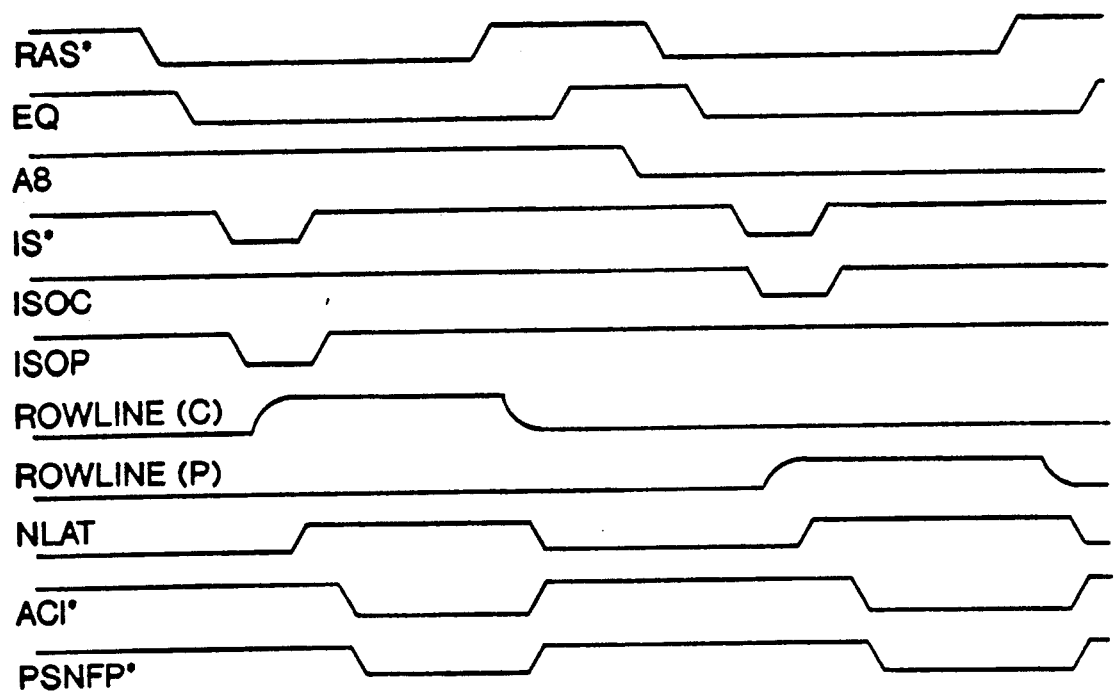
FIG. 4 is a timing diagram for a prior art DRAM showing the cycles of timing signals utilized in the array access functions.

FIG. 4 is a timing diagram of the timing signals relevant to the invention for a DRAM access cycle. It should be understood that the timing diagrams are meant to illustrate the invention only and should not be taken as precise measurements of actual signals. Referring to FIG. 4, except as indicated below, all the signals shown are derived from RAS*; that is they are generated in timing signal generator 50 by a timing chain type circuit to produce the signals as shown. The signals shown are: RAS*, the row address signal; EQ, which enables and disables the precharge circuits; the A8 row address signal; IS*, an intermediate timing signal used in the isolation transistor timing; ISOC, a signal derived from IS* and which enables and disables the isolation transistors nearest the column decoder; ISOP, a signal derived from IS* and which enables and disables the isolation transistors farthest from the column decoder (and nearest the single P-sense amplifier in the prior art); Rowline (c), the signal which is applied to the cell transistor gates of the row addressed when A8 is high, i.e. in FIG. 3, a row in the arrays 20A and 20C closest to the column decoder; Rowline (p), the signal which is applied to the cell transistor gates of the row addressed when A8 is low, i.e. in FIG. 3, a row in the arrays 20B and 20D closest to the SAMs; NLAT, the signal that enables and disables the N-sense amplifiers and the defines the N-sense operating periods; ACI*, an intermediate signal used in the P-sense amplifier timing; and PSNF*, which enables and disables the P-sense amplifiers and thus defines their operating periods. Referring to FIGS. 3 and 4, the circuit 71 functions as follows. When an access of the memory circuit 12 is made, the RAS* signal drops which causes the row line buffer 45 to place a row address on its outputs. The architecture in the preferred embodiment of FIG. 3 is designed so that when the A8 signal is high, one row in each of the arrays 20A and 20C is addressed and when the A8 signal is low, one row in each of arrays 20B and 20D is addressed. For purposes of this discussion, we will first assume that A8 is high and the rows associated with row lines 92 and 94 are addressed. Shortly after the RAS* signal drops, the CAS* signal (not shown in FIG. 4) drops and the column buffer 44 places a column address on its outputs. For purposes of this discussion, assume that the address of the column of circuit 71 is selected. Shortly after RAS* drops, EQ goes low which disables the precharge circuits 40A, 41A, 42A, and 43A. ISOP then goes low turning off isolation transistors 78A and 78B to isolate column line halves 70B and 72B and the P-sense amplifier 36A from the column line halves 70A and 702A, N-sense amplifier 32A, and P-sense amplifier 38A, and also turning off transistors 81A and 81B to isolate column line halves 74B and 76B and P-sense amplifier 37A from column line halves 74A and 76A, N-sense amplifier 33A, and P-sense amplifier 39A. For purposes of this discussion we will assume that the access is a DRAM read cycle and the signal stored in cell 18C is a logic 1 while the signal stored in cell 18E is a logic 0. While the transistors 78A, 78B, 81A, and 81B are turning off, row lines 92 and 94, responding to the address on lines 48 (FIG. 1), begin to go high turning on the transistors in cells 18C and 18E. This allows the signal stored on the capacitor of cell 18C to be placed on column line half 70A and the signal stored on the capacitor of cell 18E to be placed on column line half 74A. Thus the signal on column line half 70A will begin to rise and the signal on column line half 74A will begin to fall. As soon as these signals begin to develop, NLAT goes high turning on N-sense amplifiers 32A and 33A. The N-sense amplifiers drive the low one of the pair of column line halves to a logic 0, thus column line halves 72A and 74A will begin to go to logic 0. Once NLAT has risen and the N-sense amplifiers have begun separating the voltage on the column line pair halves 72A and 70A and the column line pair halves 74A and 76A, then IS* and thus ISOP returns high, turning on the isolation transistors 78A and 78B reconnecting column line halves 70B and 72B and the P-sense amplifier 36A to the column line halves 70A and 702A, N-sense amplifier 32A, and P-sense amplifier 38A, and also turning on isolation transistors 81A and 81B to reconnect column line halves 74B and 76B and P-sense amplifier 37A to column line halves 74A and 76A, N-sense amplifier 33A, and P-sense amplifier 39A. Then PSNF* goes low turning on P-sense amplifiers 36A, 38A, 37A, and 39A. The P-sense amplifiers drive the high one of the column line pairs they are connected across to logic 1, or as close thereto as possible. Thus column lines 70 and 76 are driven toward logic 1. Meanwhile, responding to the address on lines 46 (FIG. 1), column decoder 14 connects the column line pairs at the address output from column address buffer 44 to the data input/output lines 62 (FIG. 1); namely, column lines 70 and 72 are connected to one pair of input/output lines 62 (FIG. 1) and the column lines 74 and 76 are connected to another pair of the input/output lines 62, which sends the logic 1 stored in cell 18C and the logic 0 stored in cell 18E to the data output 56. Then RAS* returns high, causing row lines 92 and 94 then go low, shutting off the transistors in cells 18C and 18C so that subsequent voltages on the column lines 70 and 74 will not affect the status of the charge on the capacitors in the respective cells, NLAT goes low and PSNFC* goes high shutting off N-sense amplifiers 32A and 33A and P-sense amplifiers 38A and 39A, respectively, then EQ goes high enabling precharge circuits 40A, 41A, 42A, and 43A which connect column line 70 to column line 72 and column line 74 to column line 76 respectively, which causes them to charge to an intermediate level between logic 1 and logic 0.

Assume that the next access is also a DRAM read and A8 is low, and thus row decoder 16 addresses one row in each of arrays 20B and 20D. Also assume that the rows accessed are those associated with row line 91 in array 20B and row line 97 in array 20D, and that the column addressed is again that of circuit 71 shown in FIG. 3. Again RAS* and CAS* go low and initiate the output of the addresses on buffers 44 and 45, and, shortly after RAS* goes low, EQ goes low disabling precharge circuits 40A, 41A, 42A, and 43A. Then ISOC goes low, turning off transistors 79A, 79B, 80A, and 80B thus isolating column line halves 70A and 72A from column line halves 70B and 72B, respectively, and also from N-sense amplifier 32A and P-sense amplifier 36A, and also isolating column line halves 74A and 76A from column line halves 74B and 76B, respectively, and also from N-sense amplifier 33A and P-sense amplifier 37A. Next the row lines 91 and 97 begin to go high turning on the transistors in cells 18A and 18H, respectively, placing the signals in the cells on column line halves 72B and 76B, respectively. NLAT then goes high, turning on the N-sense amplifiers 32A and 33A which drives the lower of the column line halves to which they are connected to logic 0. Then, ISOC goes high again, turning on transistors 79A, 79B, 80A, and 80B thus reconnecting column line halves 70A and 72A to column line halves 70B and 72B, respectively, and also to N-sense amplifier 32A and P-sense amplifier 36A, and also reconnecting column line halves 74A and 76A to column line halves 74B and 76B, respectively, and also to N-sense amplifier 33A and P-sense amplifier 37A. Then PSNF* goes low, turning on P-sense amplifiers 36A, 37A, 38A, and 39A, which pulls up the high one of the column lines to which they are connected to logic 1, or as near thereto as possible. Meanwhile, responding to the address on lines 46 (FIG. 1), column decoder 14 connects the column line pairs at the address output from column address buffer 44 to the data input/output lines 62 (FIG. 1); namely column lines 70 and 72 are connected to one pair of input/output lines 62 (FIG. 1) and the column lines 74 and 76 are connected to another pair of the input/output lines 62, which sends the logic signals stored in cells 18C and 18E to the data output 56. Then RAS* returns high causing row lines 91 and 97 to go low turning off the transistors of cells 18A and 18H respectively, preventing the capacitors of the respective cells from being affected by subsequent voltages on column lines 72 and 76 respectively. NLAT then returns low and PSNF* returns high, shutting off N-sense amplifiers 32A and 33A and P-sense amplifiers 36A, 37A, 38A, and 39A. Finally, EQ returns high enabling precharge circuits 40A, 41A, 42A, and 43A which connect column line 70 to column line 72 and column line 74 to column line 76 respectively, which causes them to charge to an intermediate level between logic 1 and logic 0.

The above-described timing cycle is the same as that of the prior art DRAM access cycles in integrated circuit DRAMs with a single P-sense amplifier associated with each column line except for the fact that there are two P-sense amplifiers firing on each P-sense cycle. Likewise the other timing cycles, such as the refresh cycle and the VRAM cycle will be the same as that in the prior art, and thus they will not be described in detail.

Figure 5:
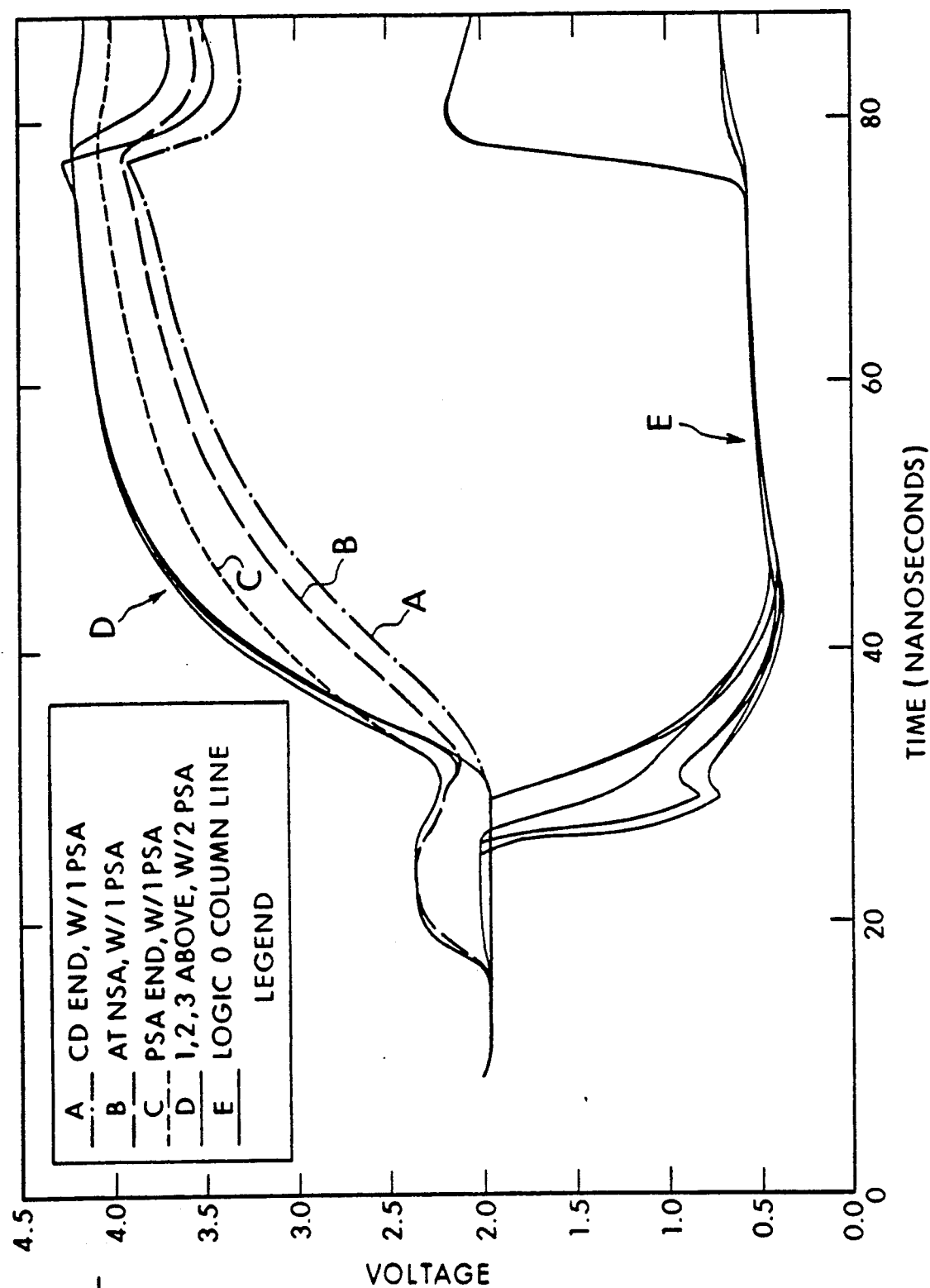
FIG. 5 is a graph of the voltage on the column lines versus time comparing the voltage response for the an amplifier architecture with one P-sense amplifier as in the prior art with the voltage response with two P-sense amplifier architecture of FIG. 3.
Figure 6:
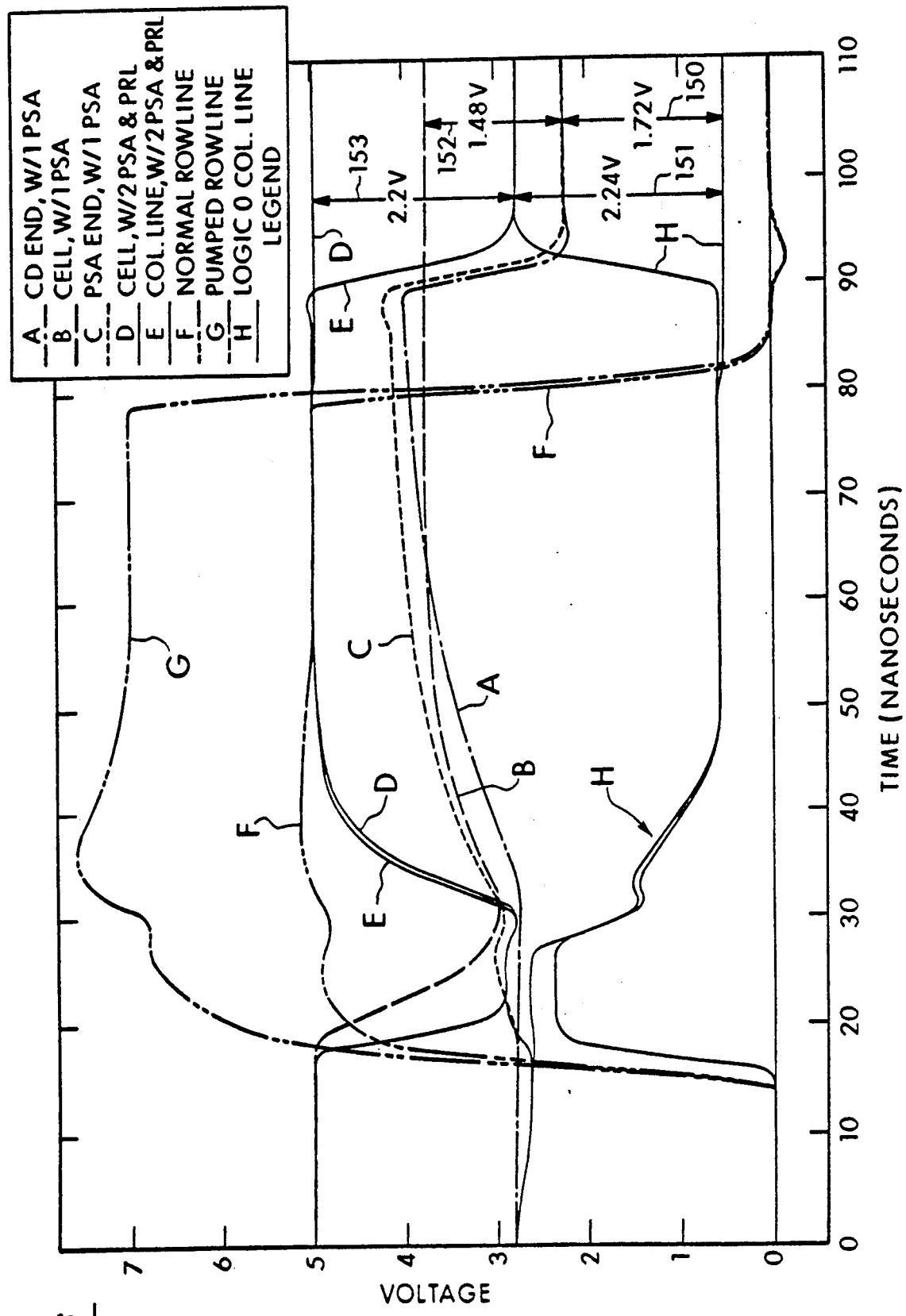
FIG. 6 is a graph of voltage versus time comparing the 1's and 0's margins for a prior art amplifier architecture with one P-sense amplifier and an unpumped row line with the 1's and 0's margin for the two P-sense amplifier architecture of FIG. 3 with a booted row line.

FIGS. 5 and 6 illustrate additional advantages of the invention. FIG. 5 is a graph of the voltage at various points on the column lines, such as 70 and 72, during a DRAM read cycle. Curves A through C and the three curves D are all voltages on the high or logic 1 column line. Curve A is the voltage at the column decoder end with the prior art one P-sense amplifier architecture, curve B is the voltage at the N-sense amplifier with the prior art one P-sense amplifier architecture, while curve C is the voltage at the P-sense amplifier end with the prior art one P-sense amplifier architecture. Curves D are the voltages at the same three points with the two P-sense amplifier architecture of FIG. 3. Curves E are the corresponding voltages on the logic 0 column line. The curves show that the logic 1 and logic 0 voltages separate significantly faster and the logic 1 voltages reach a significantly higher level with the two P-sense amplifier architecture of the invention. For example, the voltage of the logic 1 column line in the architecture according to the invention at a time of about 48 nsec is already as high as what the logic 1 column line of the prior art reaches at about 76 nsec. Thus the architecture according to the invention is about 35% faster than the prior art architecture.

FIG. 16 shows a comparison of the DRAM access cycle between the prior art one P-sense architecture without the row line pump circuits 31 and the two P-sense amplifier architecture of the invention with the row line pump circuitry 31. Curve A is the voltage at the column decoder end on the high or logic 1 column line with the prior art one P-sense amplifier architecture, curve B is the voltage at the cell associated with the high or logic 1 column line with the prior art one P-sense amplifier architecture, while curve C is the voltage at the P-sense amplifier end on the high or logic 1 column line with the prior art one P-sense amplifier architecture. Curve D is the voltage at the cell associated with the high or logic 1 column line with the two P-sense amplifier architecture and a pumped row line, while curve E is the voltage on the high or logic 1 column line with the two P-sense architecture and pumped row line. Curves H are the corresponding voltages on the logic 0 column line. Curve F is the normal row line voltage, and curve G is the pumped row line voltage. The extensions of the curves into the precharge period, on the right in FIG. 16, can be used to compare the logic 1 and logic 0 margins of the two circuits, that is the difference between the reference voltage level that the column lines come to when they are shorted together in the precharge cycle and their ultimate values in the amplification cycle. The prior art 0's margin of 1.72 volts is shown at 150, while the 0's margin with the architecture of the invention using a pumped row line is shown as 2.24 volts at 151. The prior art 1's margin of 1.48 volts is shown at 152, while the 1's margin of the architecture of the invention with a pumped row line is shown as 2.2 volts at 153. The improvement is thus about 23% in the 0's margin and about 33% in the 1's margin. The margin improvement using the two P-sense amplifier architecture alone, without a pumped row line, is about 11% for the 0's margin and 17% for the 1's margin.

There has been described a novel memory array circuit which saves a fabrication mask process, saves power, and which has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be advantageous to use dual P-sense amplifiers with each column line pair and to combine it with other features to yield further advantages, it becomes clear that other designs with dual P-sense amplifiers or incorporating the dual P-sense amplifier with other features can be useful. The invention may also be used in other types of memory than those described. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the integrated circuit memory described.

What is claimed is:

1. An integrated circuit memory comprising:
   an array of memory cells arranged in a plurality of rows and a plurality of columns, each of said memory cells comprising a transistor and a capacitor;
   a plurality of row lines, each row line connecting memory cells in a row;
   a first column line connecting memory cells in first column of the plurality of columns, said first column line divided into a first column line portion and a second column line portion;
   a first N-sense amplifier connected to said first column line; and
   first isolating means for isolating said first N-sense amplifier from said first column line portion and second isolating means for isolating said first N-sense amplifier from said second column line portion, said first N-sense amplifier connected to said first column line portion through said first isolating means and to said second column line portion through said second isolating means, wherein said first isolating means and said second isolating means each comprise transistors having the same impedance as the transistors in said memory cells.

2. An integrated circuit memory as in claim 1 wherein there are a plurality of said first column lines, each first column line is divided into a first column line portion and a second column line portion, and each first column line has associated with it one of said first N-sense amplifiers, one of said first isolating means, and one of said second isolating means.

3. An integrated circuit memory as in claim 1 and further comprising:
   input/output means for connecting said second column line portion to a circuit external of said memory array;
   row decoder means for addressing one of said rows in response to a row address signal;
   timing signal generator means for providing an N-sense timing signal defining an N-sense period, a P-sense timing signal defining a P-sense period, and an isolation timing signal related to whether the row being addressed by said row decoder means is connected to a cell connected to said first column line portion or a cell connected to said second column line portion;
   a first P-sense amplifier comprising means responsive to said P-sense timing signal for amplifying the signal on said first column line portion during said P-sense period;
   a second P-sense amplifier comprising means responsive to said P-sense timing signal for amplifying the signal on said second column line portion during said P-sense period; and
   said first isolating means comprises means responsive to said isolation timing signal for isolating said first column line portion from said second column line portion, said first N-sense amplifier, and said second P-sense amplifier during an initial portion of said N-sense period while a row line associated with said second column line portion is being addressed.

4. An integrated circuit memory as in claim 1 and further comprising:
   input/output means for connecting said first column line portion to a circuit external of said memory array;
   row decoder means for addressing one of said rows in response to a row address signal;
   timing signal generator means for providing an N-sense timing signal defining an N-sense period, a P-sense timing signal defining a P-sense period, and an isolation timing signal related to whether the row being addressed by said row decoder means is connected to a cell connected to said first column line portion or a cell connected to said second column line portion;
   a first P-sense amplifier responsive to said P-sense timing signal for amplifying the signal on said first column line portion during said P-sense period;
   a second P-sense amplifier responsive to said P-sense timing signal for amplifying the signal on said second column line portion during said P-sense period; and
   said second isolating means comprises means responsive to said isolation timing signal for isolating said second column line portion from said first column line portion, said first N-sense amplifier, and said first P-sense amplifier during the initial portion of said N-sense period while a row line associated with said first column line portion is being addressed.

5. An integrated circuit memory as in claim 1 and further comprising:
   a second column line connecting memory cells in a second column of the plurality of columns, said second column line divided into a third column line portion and a fourth column line portion;
   a second N-sense amplifier connected to said second column line; and
   third isolating means for isolating said second N-sense amplifier from said third column line portion and fourth isolating means for isolating said second N-sense amplifier from said fourth column line portion, said second N-sense amplifier connected to said third column line portion through said third isolating means and to said fourth column line portion through said fourth isolating means, wherein said third isolating means and said fourth isolating means each comprise transistors having the same impedance as the transistors in said memory cells.

6. An integrated circuit memory as in claim 5 wherein there are a plurality of said first column lines and said second column lines, each first column line is divided into a first portion and a second portion, each second column line is divided into a third column line portion and a fourth column line portion, each first column line has associated with it one of said first N-sense amplifiers, one of said first isolating means, one of said second isolating means, and each second column line has associated with it one of said second N-sense amplifiers, and each second column line has associated with it one of said second N-sense amplifiers, one of said third isolating means, and one of said fourth isolating means.

7. An integrated circuit memory comprising:
- an array of memory cells arranged in a plurality of rows and columns, each of said memory cells comprising a transistor and a capacitor;
- a plurality of row lines, each row line connecting memory cells in a row;
- a first column line pair comprising a first column line connecting memory cells in one column and a second column line connecting memory cells in an adjacent column;
- a first N-sense amplifier connected between said first column line pair and dividing said first column line pair into a first pair of column line halves and a second pair of column line halves; and
- a first isolating transistor connecting said first N-sense amplifier to one of said first pair of column line halves, a second isolating transistor connecting said first N-sense amplifier to the other of said first pair of column line halves, a third isolating transistor connecting said first N-sense amplifier to one of said second pair of column line halves, and a fourth isolating transistor connecting said first N-sense amplifier to the other of said second pair of column line halves, wherein said first, second, third, and fourth isolating transistors have the same impedance as the transistors in said memory cells.

8. An integrated circuit memory as in claim 7 wherein there are plurality of said first column line pairs, said first N-sense amplifiers, said first, second, third, and fourth isolating transistors, each first N-sense amplifier dividing one of said first column line pairs into a first pair of column line halves and a second pair of column line halves.

9. An integrated circuit memory as in claim 7 and further comprising:
- a second column line pair comprising a third column line connecting memory cells in one column and a fourth column line connecting memory cells in an adjacent column;
- a second N-sense amplifier connected between said second column line pair and dividing said second column line pair into a third pair of column line halves and a fourth pair of column line halves; and
- a fifth isolating transistor connecting said second N-sense amplifier to one of said third pair of column line halves, a sixth isolating transistor connecting said second N-sense amplifier to the other of said third pair of column line halves, a seventh isolating transistor connecting said second N-sense amplifier to one of said fourth pair of column line halves, and an eighth isolating transistor connecting said second N-sense amplifier to the other of said fourth pair of column line halves, wherein said fifth, sixth, seventh, and eighth isolating transistors have the same impedance as the transistors in said memory array.

* * * * *